United States Patent
Twynam

(10) Patent No.: US 7,538,364 B2
(45) Date of Patent: May 26, 2009

(54) COMPOUND SEMICONDUCTOR FET

(75) Inventor: John Twynam, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 273 days.

(21) Appl. No.: 10/762,572

(22) Filed: Jan. 23, 2004

(65) Prior Publication Data
US 2004/0211976 A1 Oct. 28, 2004

(30) Foreign Application Priority Data
Apr. 28, 2003 (JP) .............................. 2003-123360

(51) Int. Cl.
*H01L 31/109* (2006.01)
(52) U.S. Cl. .................. 257/192; 257/85; 257/E29.033
(58) Field of Classification Search ................. 257/192, 257/85, E29.033; 438/285, 590
See application file for complete search history.

(56) References Cited

U.S. PATENT DOCUMENTS

| | | | | |
|---|---|---|---|---|
| 5,192,987 | A * | 3/1993 | Khan et al. | 257/183.1 |
| 5,751,029 | A * | 5/1998 | Matsushita et al. | 257/194 |
| 5,895,929 | A * | 4/1999 | Abrokwah et al. | 257/20 |
| 5,929,467 | A * | 7/1999 | Kawai et al. | 257/192 |
| 6,064,082 | A * | 5/2000 | Kawai et al. | 257/192 |
| 6,100,106 | A * | 8/2000 | Yamaguchi et al. | 438/46 |
| 6,342,411 | B1 * | 1/2002 | Pitts, Jr. | 438/173 |
| 6,447,938 | B1 * | 9/2002 | Bianchi | 428/698 |
| 6,465,815 | B2 * | 10/2002 | Liu et al. | 257/194 |
| 6,479,843 | B2 * | 11/2002 | Huang et al. | 257/192 |
| 6,521,961 | B1 * | 2/2003 | Costa et al. | 257/402 |
| 6,583,454 | B2 * | 6/2003 | Sheppard et al. | 257/194 |
| 6,639,255 | B2 * | 10/2003 | Inoue et al. | 257/194 |
| 6,690,035 | B1 * | 2/2004 | Yokogawa et al. | 257/77 |
| 6,770,902 | B2 * | 8/2004 | Phillips | 257/20 |
| 6,841,410 | B2 * | 1/2005 | Sasaoka | 438/47 |
| 6,992,319 | B2 * | 1/2006 | Fahimulla et al. | 257/20 |
| 6,995,397 | B2 * | 2/2006 | Yamashita et al. | 257/77 |
| 7,030,428 | B2 * | 4/2006 | Saxler | 257/194 |
| 2001/0020700 | A1 * | 9/2001 | Inoue et al. | 257/20 |
| 2003/0178633 | A1 * | 9/2003 | Flynn et al. | 257/101 |
| 2005/0006639 | A1 * | 1/2005 | Dupuis et al. | 257/20 |

FOREIGN PATENT DOCUMENTS

EP 0531621 A2 * 3/1993

\* cited by examiner

*Primary Examiner*—Eugene Lee
(74) *Attorney, Agent, or Firm*—Morrison & Foerster LLP

(57) ABSTRACT

On a substrate of a GaN FET, an undoped AlN layer, a GaN delta doped layer, an undoped GaN layer, and an undoped $Al_{0.2}Ga_{0.8}N$ layer are formed in sequence. Arranged on the undoped $Al_{0.2}Ga_{0.8}N$ layer are a Ti/Al/Pt/Au source ohmic electrode, a Pt/Au gate Schottky electrode, and a Ti/Al/Pt/Au drain ohmic electrode. Parallel conduction and gate leak are reduced or eliminated by the GaN delta doped layer.

6 Claims, 8 Drawing Sheets

COMPOUND SEMICONDUCTOR FET

BACKGROUND OF THE INVENTION

The present invention relates to a compound semiconductor FET (Field Effect Transistor) and electronic circuits using the same, and more particularly, to a GaN semiconductor FET.

Conventionally, there have been known GaN heterojunction FETs (GaN HFETs). As an example, a GaN heterojunction FET disclosed in U.S. Pat. No. 5,192,987 will be described with reference to FIG. 7. Semiconductor layers of FIG. 7 are of the hexagonal C-plane Ga-surface type. In the semiconductor layers and metal layers of FIG. 7, reference numeral 21 denotes a sapphire substrate, 22 denotes a 100 nm thick undoped AlN layer, 23 denotes a 1 μm thick undoped GaN layer, 24 denotes a 30 nm thick undoped $Al_{0.2}Ga_{0.8}N$ layer, 25 denotes a Ti/Al/Pt/Au source ohmic electrode, 26 denotes a Pt/Au gate Schottky electrode, and 27 denotes a Ti/Al/Pt/Au drain ohmic electrode.

A channel is generated at an interface between the undoped GaN layer 23 and the $Al_{0.2}Ga_{0.8}N$ layer 24, causing a two-dimensional electron gas (2DEG) of electrons to be generated. The concentration of this 2DEG is controlled with a bias voltage applied to the Pt/Au gate Schottky electrode. When the applied bias voltage goes beyond the "pinchoff voltage Vp" of the device, the concentration of the 2DEG becomes zero.

However, conventional GaN HFETs have a problem that even if the gate voltage goes beyond the pinchoff voltage Vp with the result of a zero concentration of 2DEG, there would remain electric charges under the gate so that application of a voltage to between source and drain would cause a current flow. This phenomenon is called as "parallel conduction." Referring to DC characteristics (drain current-drain voltage characteristics) of a conventional GaN HFET shown in FIG. 10, because of a low output resistance, there occurs no pinchoff even when a bias voltage Vg has reached the pinchoff voltage (Vp=−4 V).

Another problem of GaN HFETs is that when the gate voltage goes beyond the pinchoff Vp, there would flow a gate leak current. This phenomenon is called as "gate leak". Referring to gate-source Schottky diode characteristics of conventional GaN HFETs shown in FIG. 11, there can be recognized a characteristic that the leak current linearly increases as the reverse bias voltage of the gate increases above a certain voltage.

The smaller the thickness of the GaN layer 23 is, the more noticeable these problems of "pinchoff" and "gate leak" become.

SUMMARY OF THE INVENTION

An object of the present invention is to solve or reduce the parallel conduction and the gate leak in compound semiconductor FETs.

Whereas the problem of parallel conduction in GaN HFETs is generally recognized, its causes have not been resolved. The present inventor repeated measurements and simulations, thereby finding that the issue of parallel conduction and the issue of gate leak result from the same cause. This cause can be considered to lie in the presence of a two-dimensional hole gas (2DHG) at the AlN/GaN interface.

There is a difference in spontaneous polarization between hexagonal GaN and AlN. Besides, strain in either one of the materials causes a polarization due to a piezoelectric effect. These spontaneous polarization and piezoelectric polarization generate a discontinuity of electric fields at the AlN/GaN heterojunction interface of conventional GaN HFETs. The electric-field discontinuity leads to the generation of a 2DHG.

FIG. 8 shows results of a simulation performed with consideration of the effects of spontaneous polarization and piezoelectric polarization in a conventional GaN HFET shown in FIG. 7. FIG. 8 gives results of the simulation under a condition where the gate bias voltage is zero, showing an energy band diagram, an electron concentration, and a hole concentration. The hole sheet concentration (ps) of the 2DHG present at the AlN/GaN heterojunction interface is $1.8 \times 10^{13}$ $cm^{-2}$. The 2DHG serves as a channel parallel to the original-channel at the GaN/AlGaN interface (with 2DEG concentration ns=$9.4 \times 10^{12}$ $cm^{-2}$), causing conduction of the current by the voltage between source and drain. This causes the parallel conduction.

In the conventional GaN HFET shown in FIG. 7, an undesirable current also flows through the Schottky gate electrode due to the 2DHG present at the AlN/GaN hetero-interface. FIG. 9 gives results of a simulation in the case where a high negative voltage is applied to the gate electrode of FIG. 7 so that the concentration of the 2DEG present at the GaN/AlGaN interface becomes zero, showing the energy band diagram, electron concentration and hole concentration. The hole current flows from the 2DHG to the gate electrode. This causes the gate leak.

The present invention has been accomplished based on the above-described findings.

In a first aspect of the present invention provides a compound semiconductor FET comprising an AlN layer provided on a substrate, an n-type delta doped III-N layer provided on the AlN layer, a plurality of III-N layers provided on the n-type delta doped III-N layer, a source electrode, a gate electrode, and a drain electrode.

In the compound semiconductor FET, the n-type delta doped III-N layer provided at the interface of the AlN layer and the III-N layer reduces a 2DHG generated at the interface between the AlN layer and the III-N layer, resulting in that both parallel conduction and gate leak is eliminated or reduced.

The term "III-N layer" as used herein refers to a compound semiconductor layer containing a group-III element and N element.

More specifically, the n-type delta doped III-N layer is an n-type delta doped GaN layer, the plurality of III-N layers comprise a GaN layer and an AlGaN layer formed on the GaN layer, and the source electrode, the gate electrode and the drain electrode are provided on the AlGaN layer.

Alternatively, the n-type delta doped III-N layer is an n-type delta doped GaN layer, and the plurality of III-N layers comprise a GaN layer and an AlGaN layer formed on the GaN layer, wherein the compound semiconductor FET further comprises an insulating layer on the AlGaN layer, and wherein the source electrode and the drain electrode are provided on the AlGaN layer, and moreover the gate electrode is provided on the insulating film.

Preferably, dopant concentration of the n-type delta doped III-N layer is set so as to reduce discontinuity of an electric field at an interface between the AlN layer and the III-N layer.

In a case where the material of the substrate is sapphire and each of the semiconductor layers is formed of a semiconductor having a C-plane Ga-surface, it is preferable that the sheet doping concentration of the n-type delta doped III-N layer is within a range of $1 \times 10^{13}$ $cm^{-2}$ to $2 \times 10^{13}$ $cm^{-2}$.

In a case where the material of the substrate is SiC and each of the semiconductor layers is formed of a C-plane Ga-surface oriented semiconductor, it is preferable that the sheet doping concentration of the n-type delta doped III-N layer is within a range of $5 \times 10^{12}$ cm$^{-2}$ to $1.5 \times 10^{13}$ cm$^{-2}$.

A second aspect of the present invention provides an electronic circuit provided with the above-mentioned compound semiconductor FET.

BRIEF DESCRIPTION OF THE DRAWINGS

These and other objects and features of the present invention will become apparent from the following description taken in conjunction with preferred embodiments thereof with reference to the accompanying drawings, in which.

DETAILED DESCRIPTION OF THE PREFERRED EMBODIMENTS

First Embodiment

Figure 1:
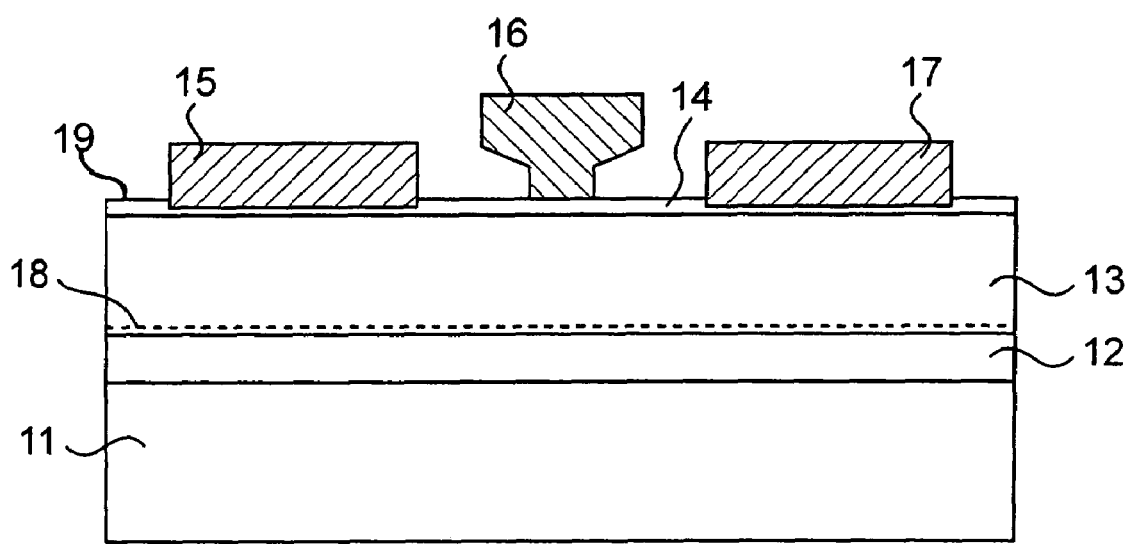
FIG. 1 is a schematic structural view showing a GaN FET according to a first embodiment of the invention.

In FIG. 1, a structure of a GaN HFET according to a first embodiment of the invention is shown. In the semiconductor layers and metal layers shown in FIG. 1, reference numeral 11 denotes a substrate, 12 denotes a 100 nm thick undoped AlN layer, 18 denotes a GaN delta doped layer (with sheet doping concentration ns=$1.5 \times 10^{13}$ cm$^{-2}$), 13 denotes a 1 μm thick undoped GaN layer, 14 denotes a 30 nm thick undoped Al$_{0.2}$Ga$_{0.8}$N layer, 15 denotes a Ti/Al/Pt/Au based source ohmic electrode, 16 denotes a Pt/Au based gate Schottky electrode, and 17 denotes a Ti/Al/Pt/Au based drain ohmic electrode.

The present invention features in that the GaN delta doped layer 18 is placed at the interface between the undoped AlN layer 12 and the undoped GaN layer 13. The term "delta doped layer" refers to a layer in which dopants are doped in an extremely thin layer. The thickness of the delta doped layer 18 is ideally 0 nm but actually the layer has some degree of thickness. In the present invention, the thickness is preferably not more than 50 nm.

The process for fabrication of the GaN HFET will be outlined. The material of the substrate 11 is sapphire. On this substrate 11 each of semiconductor layers is grown by molecular beam epitaxy (MBE). After the crystal growth of the undoped AlN layer 12, the GaN delta doped layer 18, the undoped GaN layer 13, and the undoped AlGaN layer 14 in succession, the electrodes 15, 16, and 17 are formed on the undoped AlGaN layer 14. The undoped GaN layer 13 is of the C-plane Ga-surface type.

In the GaN delta doped layer 18, Si is the dopant. The sheet doping concentration Ns of the Si is $1.5 \times 10^{13}$ cm$^{-2}$.

Figure 2:
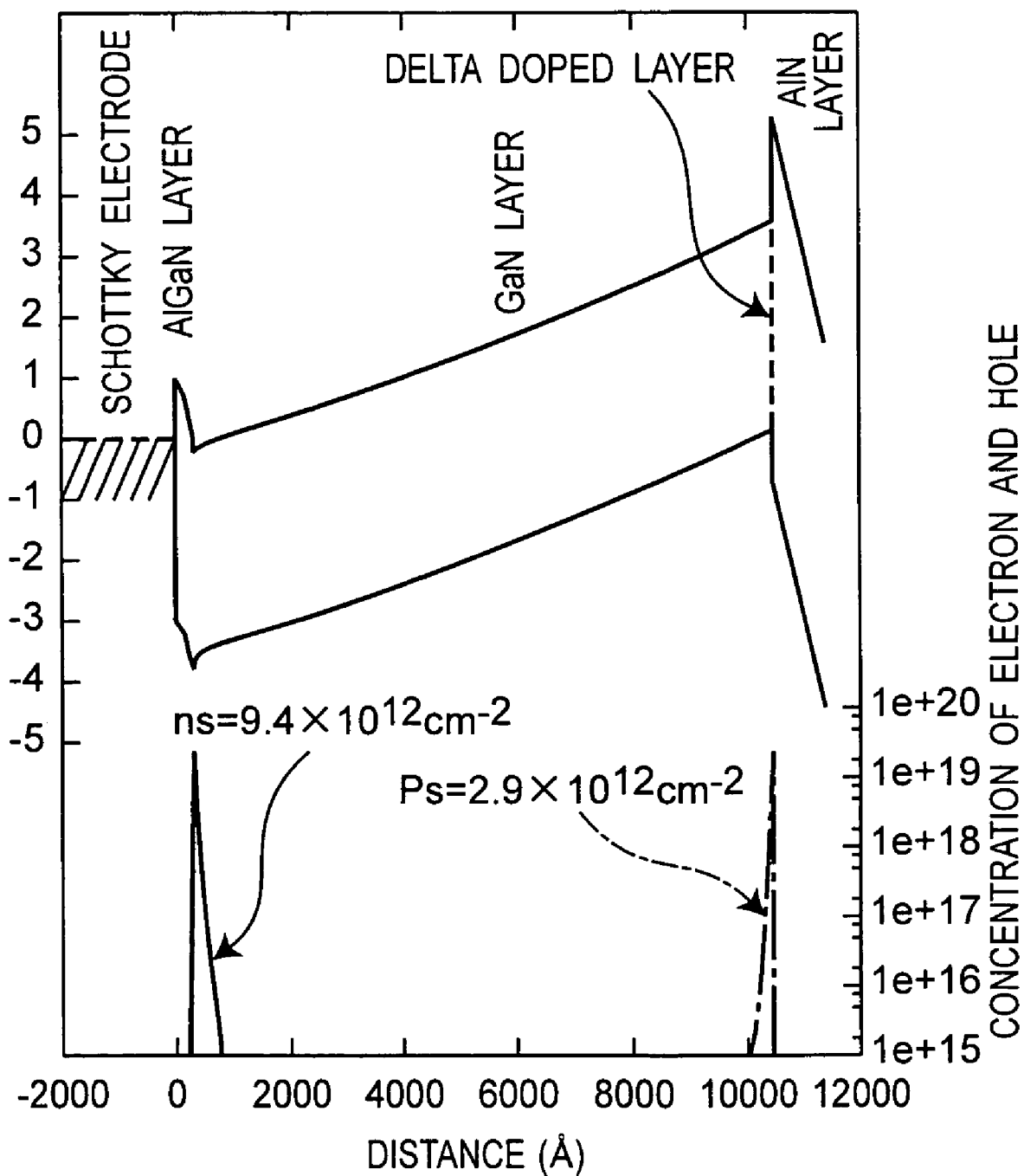
FIG. 2 is a diagram showing an energy band diagram, an electron concentration, and a hole concentration of a GaN FET according to the first embodiment.
Figure 8:
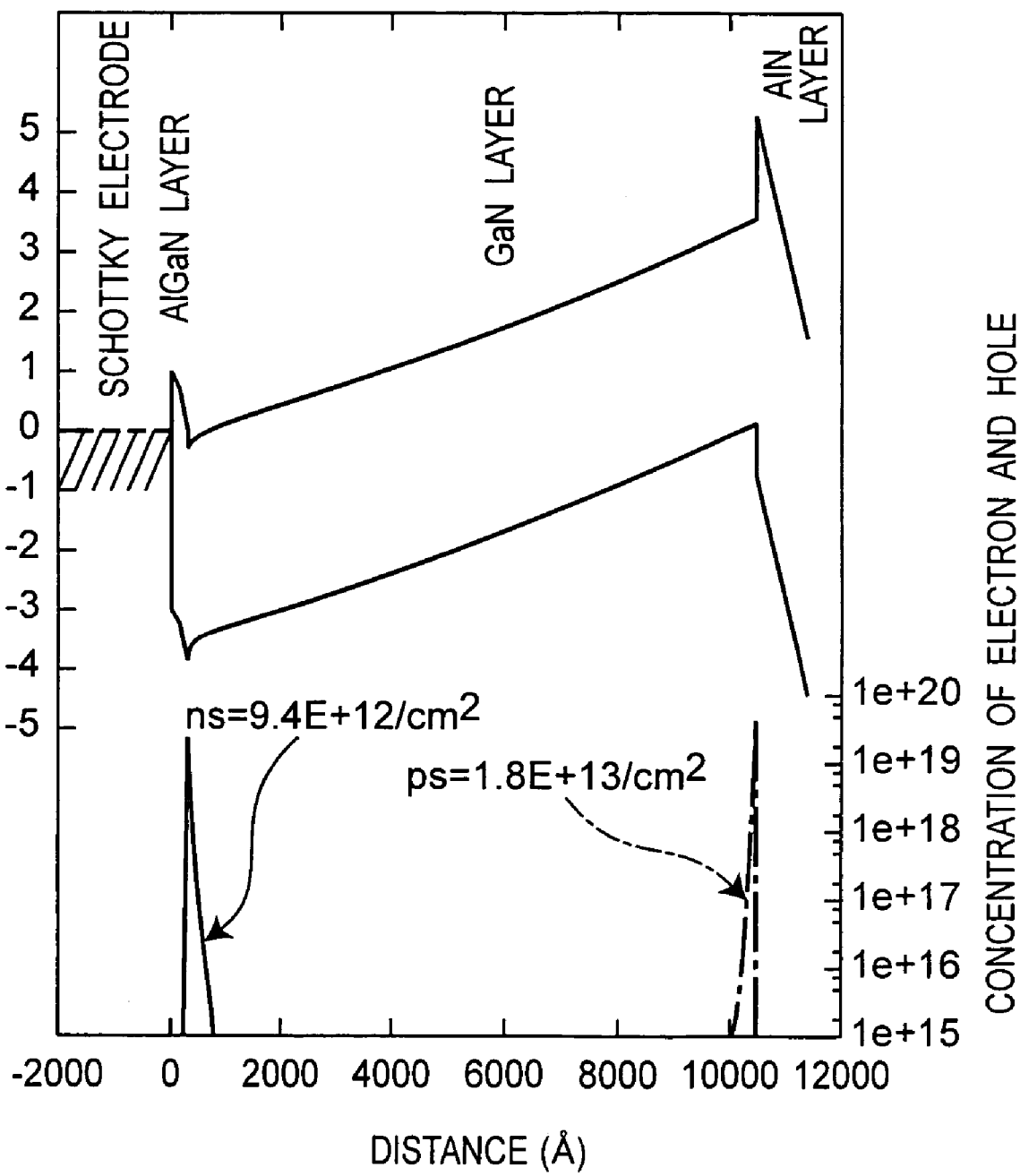
FIG. 8 is a diagram showing an energy band diagram, an electron concentration, and a hole concentration of a conventional GaN FET.
Figure 9:
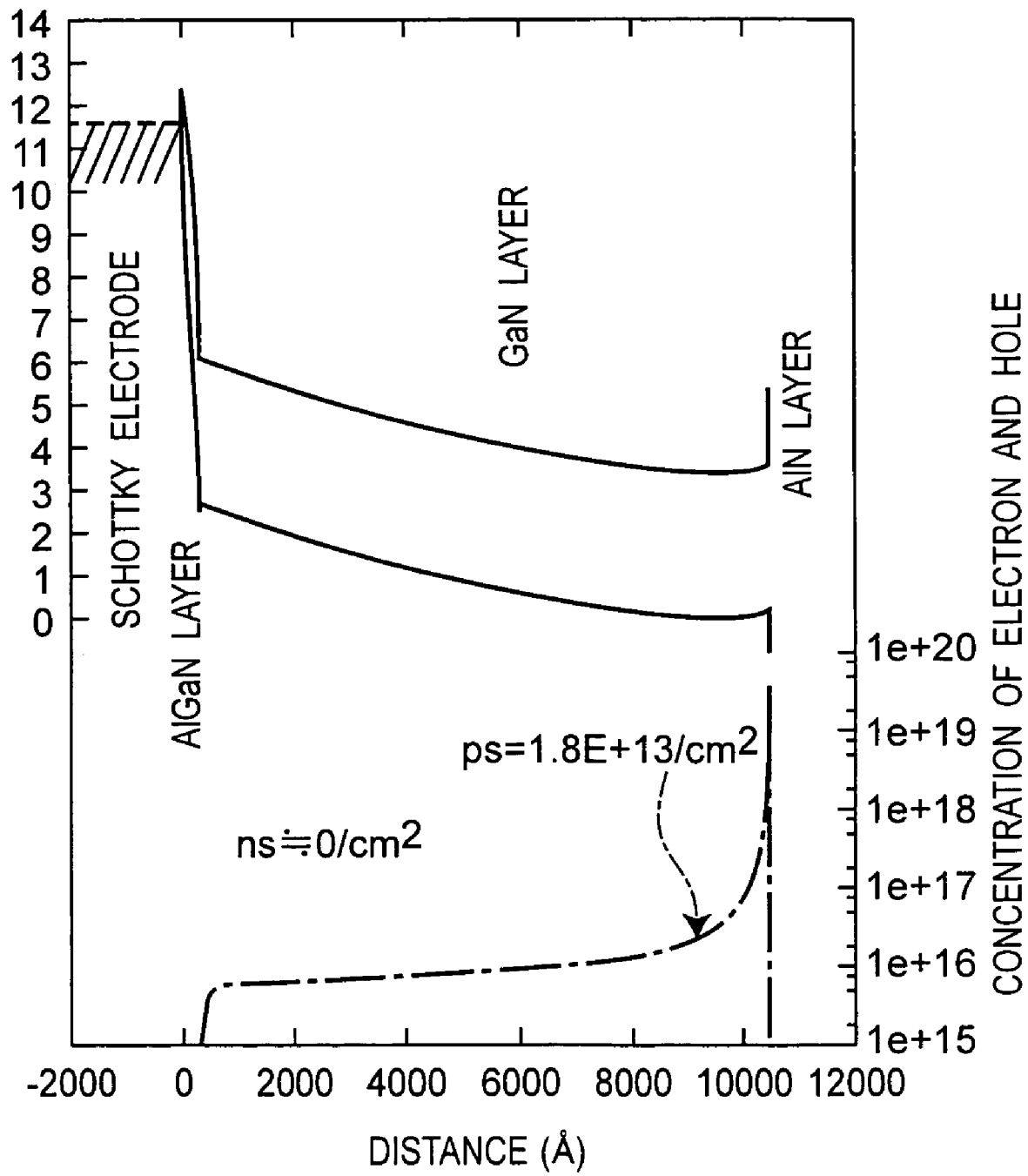
FIG. 9 is a diagram showing an energy band diagram, an electron concentration, and a hole concentration of a conventional GaN FET with a high reverse bias voltage.
Figure 10:
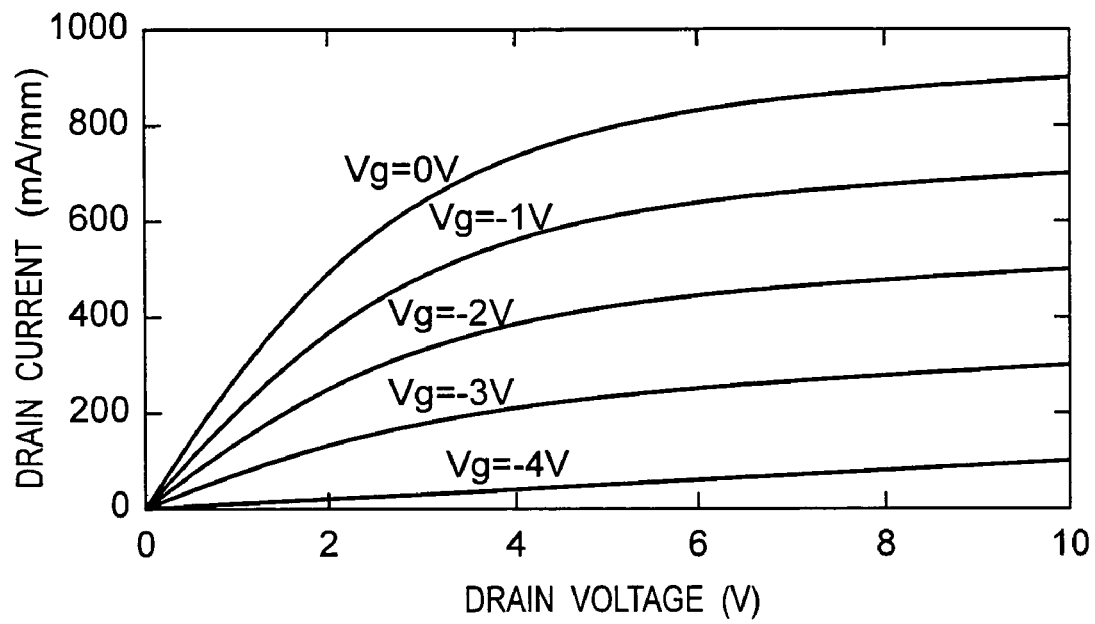
FIG. 10 is a view showing DC characteristics of a conventional GaN HFET.
Figure 11:
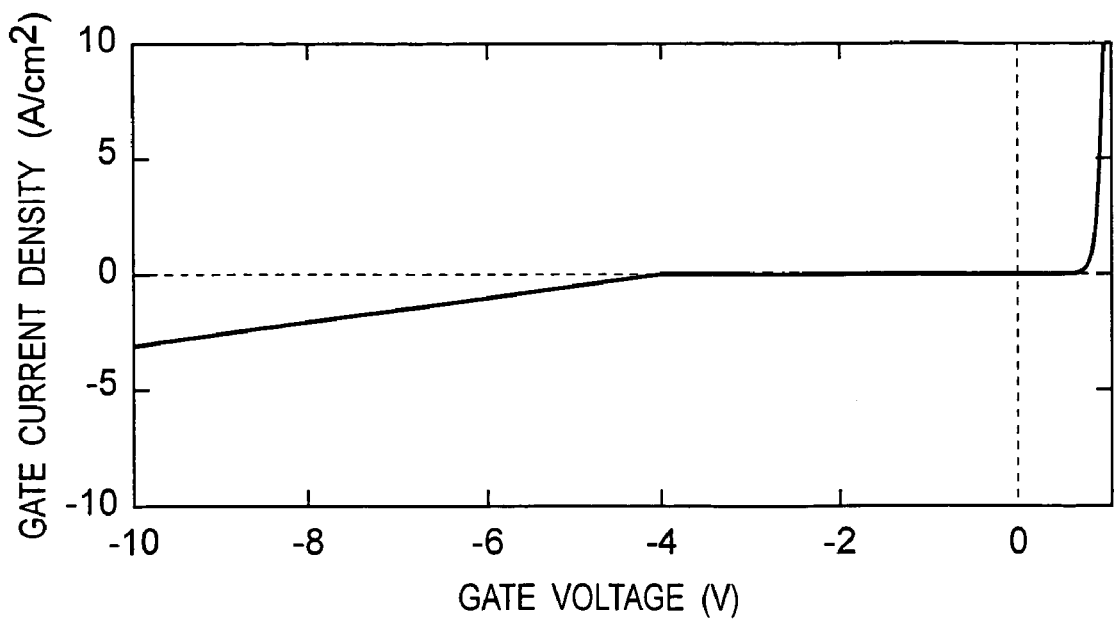
FIG. 11 is a view showing gate schottky diode characteristics of a conventional GaN HFET.

FIG. 2 shows results of a simulation performed with consideration of the effects of spontaneous polarization and piezoelectric polarization in the GaN HFET having the structure of FIG. 1. FIG. 2 gives results of a simulation under a condition where the gate bias voltage is zero, showing an energy band diagram, an electron concentration, and a hole concentration. Although the 2DHG is still present at the AlN/GaN heterojunction interface, its hole concentration ps is $2.9 \times 10^{12}$ cm$^{-2}$. The hole sheet concentration ps is lower than the hole sheet concentration of the 2DHG in the conventional GaN HFET, which is $1.8 \times 10^{13}$ cm$^{-2}$ as shown in FIG. 8. The 2DHG acts as a channel parallel to the original-channel GaN/AlGaN interface (which has 2DEG concentration ns=$9.4 \times 10^{12}$ cm$^{-12}$). However, due to the lower hole concentration, the value of a current conducted by the voltage between the source and the drain is decreased. In other words, the parallel conduction is reduced.

Figure 3:
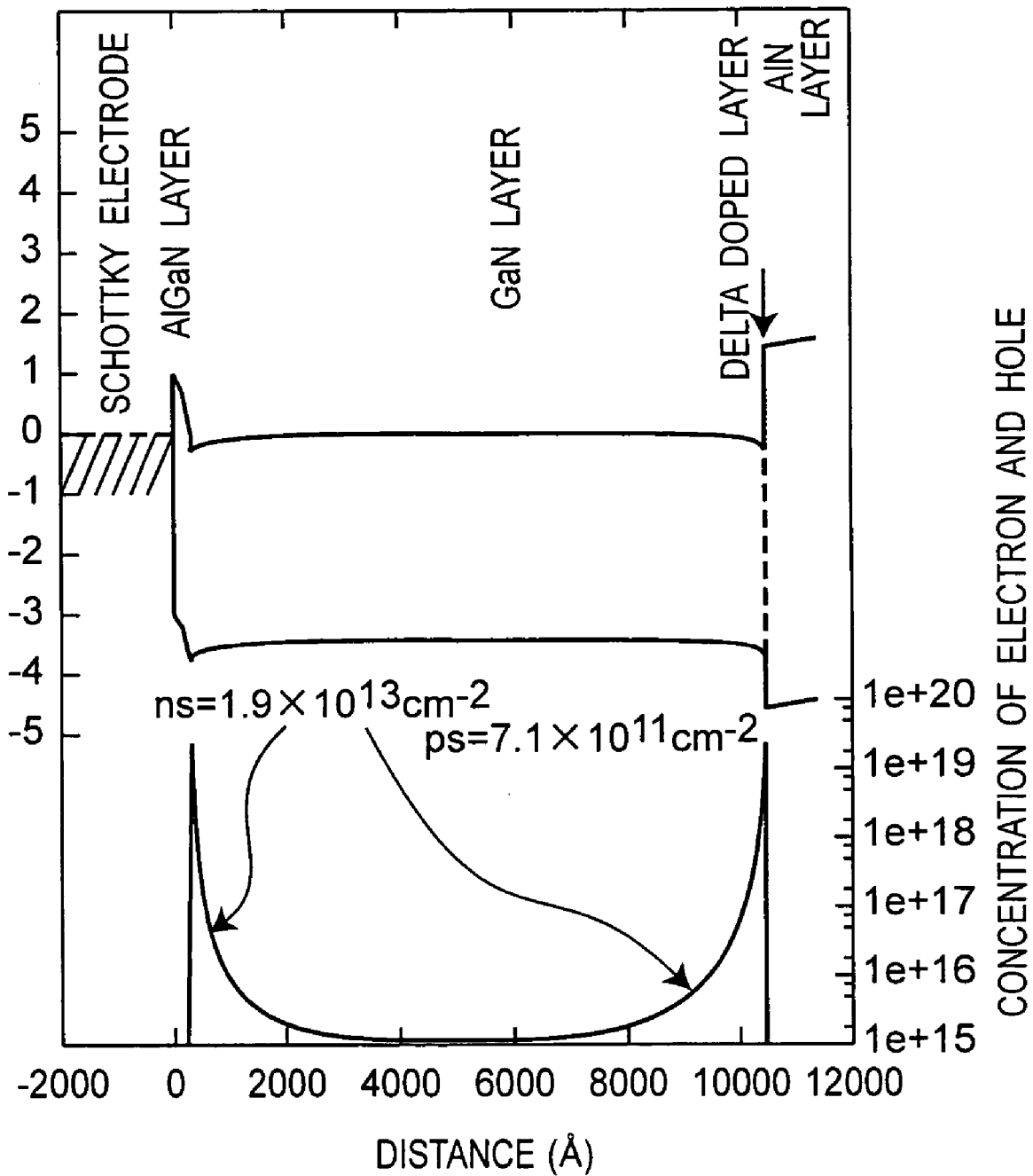
FIG. 3 is a diagram showing an energy band diagram, an electron concentration, and a hole concentration of a GaN FET in a case where the sheet doping concentration of the delta doped layer is excessively high.

FIG. 3 is also a diagram showing an energy band diagram, an electron concentration, and a hole concentration of a GaN HFET. The structure of the GaN HFET of FIG. 3 differs from that of FIG. 1 only in that the sheet doping concentration of the GaN delta doped layer 18 is higher. More specifically, whereas the sheet doping concentration Ns of the GaN delta doped layer 18 in the structure of FIG. 1 is $1.5 \times 10^{13}$ cm$^{-2}$, the sheet doping concentration Ns of the GaN delta doped layer 18 in the structure of FIG. 3 is $3.0 \times 10^{13}$ cm$^{-2}$. As shown in FIG. 3, due to an excessively high doping concentration of the delta doped layer, a 2DEG is generated at the AlN/GaN interface. The 2DEG serves as a channel parallel to the GaN/AlGaN interface (with its 2DEG concentration ns=$9.4 \times 10^{12}$ cm$^{-2}$), causing the total electron sheet concentration to increase to $1.9 \times 10^{13}$ cm$^{-2}$ and causing a parallel current to flow when a voltage is applied between the source and the drain.

The sheet doping concentration Ns of the GaN delta doped layer 18 at the AlN/GaN interface is, most effectively, within a range of 0<Ns≦Nsmax (the value of Ns may be a little over Nsmax as long as an electron concentration of the generated 2DEG is low). The maximum sheet doping concentration Nsmax is such a concentration that the discontinuity of the electric field present at the AlN/GaN interface is exactly compensated. In the case that the C-plane Ga-surface GaN layer is provided on a sapphire substrate, Nsmax is $2 \times 10^{13}$ cm$^{-2}$. In the case that a C-plane Ga-surface GaN layer is provided on a SiC substrate, Nsmax is $1.5 \times 10^{13}$ cm$^{-2}$.

In the case of the sapphire substrate, the sheet doping concentration is preferably within a range of $1 \times 10^{13}$ cm$^{-2}$<Ns<$2 \times 10^{13}$ cm$^{-2}$. This is because that if the concentration is lower than $1 \times 10^{13}$ cm$^{-2}$, hole charges due to the spontaneous polarization cannot be sufficiently compensated, so that neither "parallel conduction" nor "gate leak" can be sufficiently reduced. Further, if Ns is higher than Nsmax, hole charges due to the spontaneous polarization are compensated excessively. The excessive compensation increases electron charge, thereby causing the "parallel conduction."

In the case of a SiC substrate, the concentration is preferably within a range of $5 \times 10^{12}$ cm$^{-2}$<Ns<$1.5 \times 10^{13}$ cm$^{-2}$. The reason of this is similar to that of the case of the sapphire substrate. Strain of the AlN layer, which differs in numerical value, varies depending on the substrate. The upper and lower limits of Ns are determined according to the material of the substrate.

The current that flows from the 2DHG to the gate electrode at the AlN/GaN hetero-interface which causes the gate leak decreases with increasing sheet resistance of the 2DHG. Therefore, higher sheet resistance is desirable.

In the present invention, since the concentration of the 2DHG present at the AlN/GaN hetero-interface is decreased by the n-type GaN delta doped layer 18, the gate leak current decreases.

Second Embodiment

A GaN HFET of a second embodiment of the present invention has a similar construction to that of the first embodiment shown in FIG. 1 except that the material of the substrate 11 is SiC, that the method of growth of semiconductor layers is the metal-organic chemical vapor deposition (MOCVD), that the thickness of the undoped GaN layer 13 is 2 μm, and that the sheet doping concentration of the GaN delta doped layer 18 is $1.0 \times 10^{13}$ cm$^{-2}$. Simulation results were similar to those of the first embodiment.

Third Embodiment

Figure 4:
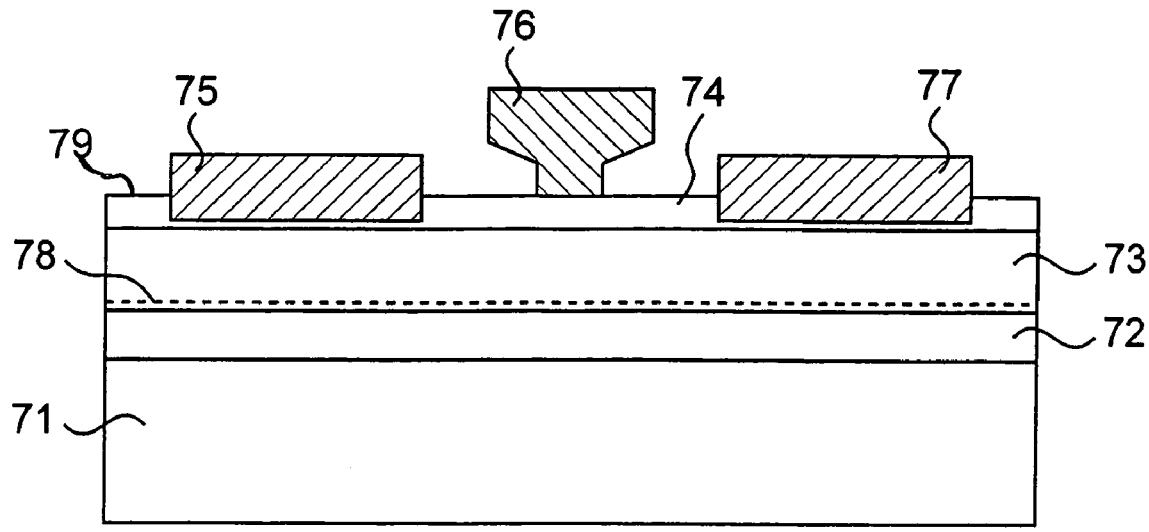
FIG. 4 is a schematic structural view showing a GaN FET according to a second embodiment of the invention.
Figure 5:
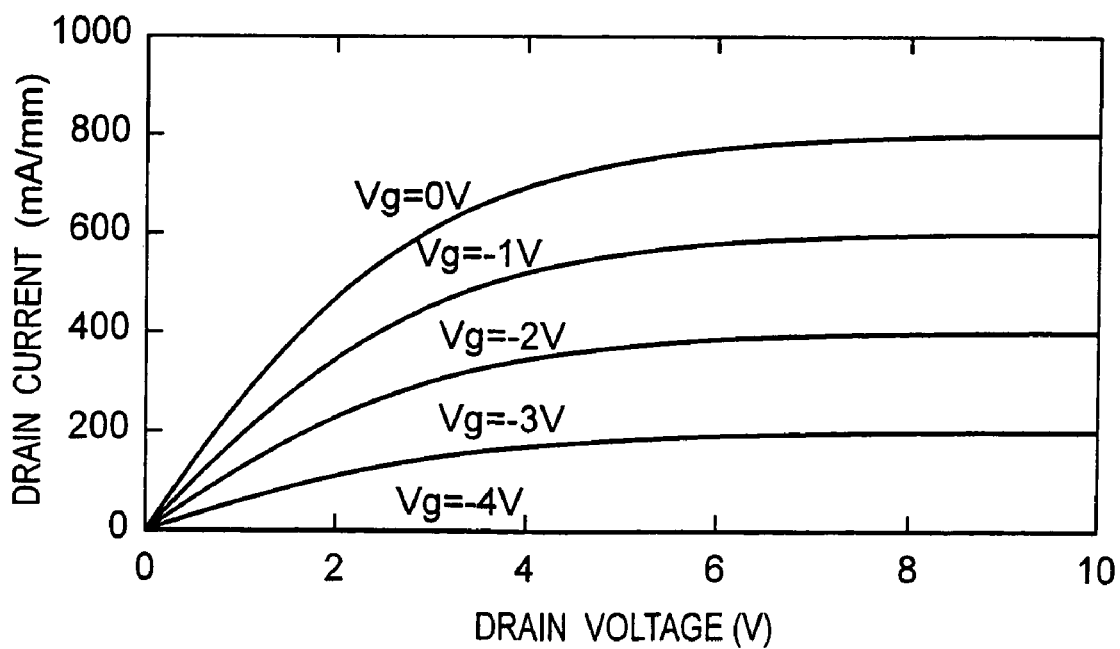
FIG. 5 is a diagram showing DC characteristics of a GaN HFET according to an embodiment of the invention.
Figure 6:
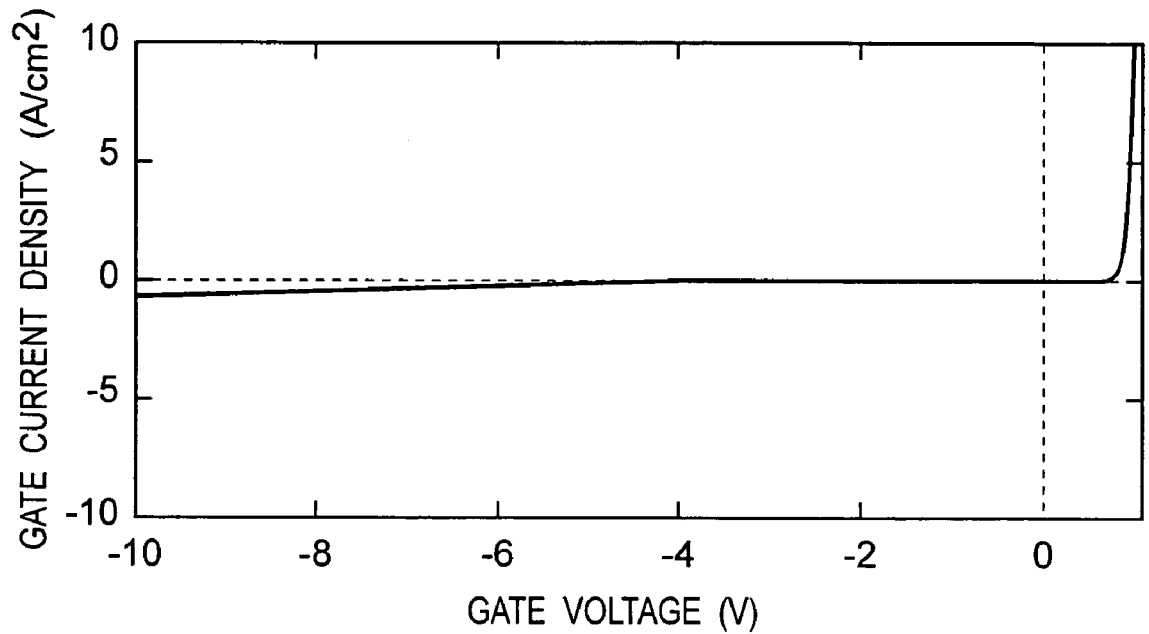
FIG. 6 is a diagram showing DC characteristics of a GaN HFET according to an embodiment of the invention.
Figure 7:
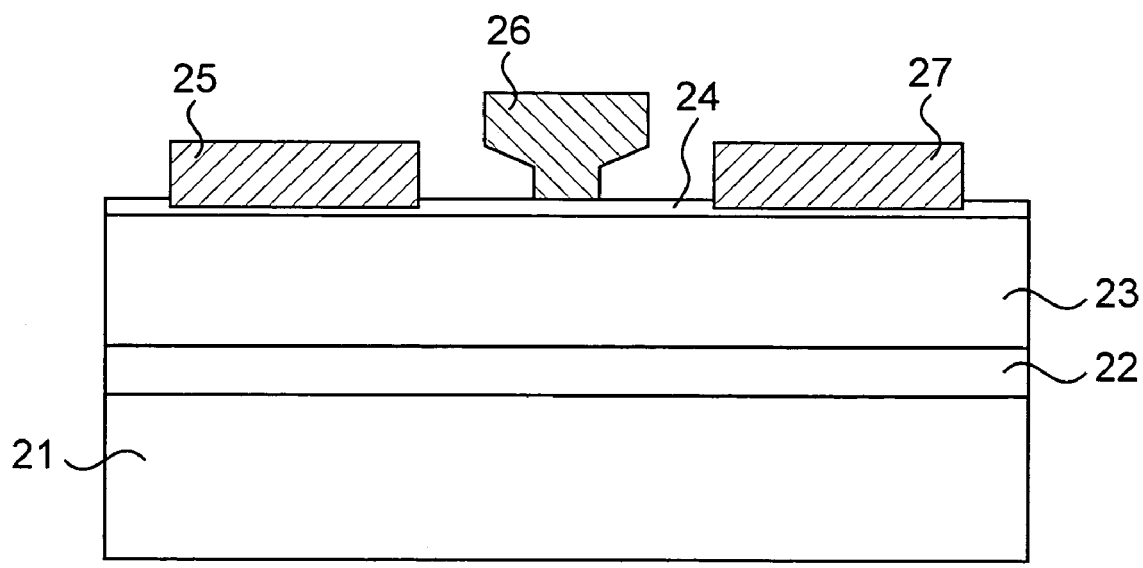
FIG. 7 is a schematic structural view showing a conventional GaN FET.

FIG. 4 shows the construction of a GaN HFET according to a third embodiment. The growth method for semiconductor layers in the third embodiment is MBE, and an undoped GaN layer 73 is of the C-plane Ga-surface type. The undoped GaN layer 73 is so thin as 0.75 μm that the cost for growth is reduced. In the structure of the conventional HFET shown in FIG. 7, when the GaN layer is thin like this, the problems of "parallel conduction" and "gate leak" become particularly noticeable.

In semiconductor layers and metal layers of this GaN HFET, reference numeral 71 denotes a sapphire substrate, 72 denotes a 50 nm thick undoped AlN layer, 78 denotes a GaN delta doped layer (with sheet doping concentration Ns=$1.9 \times 10^{13}$ cm$^{-2}$), 73 denotes a 0.75 μm thick undoped GaN layer, 74 denotes a 50 nm thick undoped Al$_{0.2}$Ga$_{0.8}$N layer, 75 denotes a Ti/Al/Pt/Au source ohmic electrode, 76 denotes a Pt/Au gate Schottky electrode, and 77 denotes a Ti/Al/Pt/Au drain ohmic electrode.

The thickness of the undoped Al$_{0.2}$Ga$_{0.8}$N layer 74 in the third embodiment is 50 nm, thicker than that of ordinary Ga HFETs. This structure with a thicker undoped Al$_{0.2}$Ga$_{0.8}$N layer 74 is effective in that the pinchoff voltage Vp becomes higher which results in higher electron velocity. However, the thicker undoped Al$_{0.2}$Ga$_{0.8}$N layer 74 increase the impedance of the whole GaN HFET, resulting in that the undesirable effect of "parallel conduction" due to the parallel hole channel becomes further noticeable.

Nonetheless, in the third embodiment, since the "parallel conduction" is reduced by the GaN delta doped layer 78, the GaN FET operates successfully even with the structure of a thick undoped AlGaN layer 74. That is, in a case where the undoped GaN layer 73 is thin and the undoped AlGaN layer 74 is thick, the GaN delta doped layer 78 of the present invention is particularly effective.

As described above, the sheet doping concentration Ns of the GaN delta doped layer 78 is $1.9 \times 10^{13}$ cm$^{-2}$. Because of such a high sheet doping concentration required for the GaN delta doped layer 78, the GaN delta doped layer 78 needs to have a certain extent of thickness. Since the maximum n-type doping concentration of GaN is approximately $5 \times 10^{18}$ cm$^{-3}$, the thickness of the GaN delta doped layer needs to be not less than 40 nm to obtain a GaN delta doped layer having a sheet doping concentration of $2 \times 10^{13}$ cm$^{-2}$.

Although the foregoing embodiments have been described with respect to Metal Semiconductor Field Effect Transistors (MESFETs), it is also possible to further provide an insulating layer (reference numerals 19 and 79 in FIGS. 1 and 4, respectively) on the AlGaN layer to adopt Metal Insulator Semiconductor Field Effect Transistors (MISFETs). In the case of MISFETs, there is no possibility of occurrence of "gate leak" essentially. However, the problem of "parallel conduction" can be solved by the present invention as in the case of MESFETs.

In all of the embodiments shown above, the heterojunction of AlN/GaN is abrupt. However, the AlN/GaN heterojunction may also be provided in continuous or stepwise gradation in terms of x in Al$_x$Ga$_{1-x}$N. In the case where the heterojunction is in gradation, the thickness of the delta doped layer is desirably set approximately equal to the thickness of the gradation.

For power amplifier (PA) circuits provided at base stations of cellular phones, the GaN HFET of the present invention is particularly effective. The reason of this is that because high-power PAs in cellular-phone base stations involve high applied voltages, the problem of gate leak is especially liable to occur. The GaN HFET of the invention is effective also for circuits (such as LNAs, mixers, and switches) other than PAs.

Although the present invention has been fully described in conjunction with preferred embodiments thereof with reference to the accompanying drawings, various changes and modifications are apparent to those skilled in the art. Such changes and modifications should be construed as included therein unless they depart from the scope of the invention as defined by the appended claims.

What is claimed is:

1. A compound semiconductor FET comprising:
   an undoped AlN layer provided on a substrate;
   a plurality of III-N layers provided on the AlN layer, the III-N layers including an undoped GaN layer;
   an n-type delta doped GaN layer interposed between the undoped AlN layer and the undoped GaN layer, and having dopant concentration for reducing discontinuity of an electric field at an interface between the undoped AlN layer and the undoped GaN layer;
   a source electrode;
   a gate electrode; and
   a drain electrode.

2. The compound semiconductor FET according to claim 1,
   wherein the plurality of III-N layers comprise an AlGaN layer formed on the undoped GaN layer, and
   wherein the source electrode, the gate electrode, and the drain electrode are provided on the AlGaN layer.

3. The compound semiconductor FET according to claim 1, further comprising an insulating layer on an uppermost layer of the plurality of III-N layers,
   wherein the plurality of III-N layers comprise an AlGaN layer formed on the undoped GaN layer,
   wherein the source electrode and the drain electrode are provided on the AlGaN layer, and
   wherein the gate electrode is provided on the insulating layer.

4. The compound semiconductor FET according to claim 1, wherein material of the substrate is sapphire,
   wherein each of the semiconductor layers formed upon the substrate is of a C-plane Ga-surface type, and wherein sheet doping concentration of the n-type delta doped GaN layer is within a range of $1\times10^{13}$ cm$^{-2}$ to $2\times10^{13}$ cm$^{-2}$.

5. The compound semiconductor FET according to claim 1, wherein material of the substrate is SiC,
wherein each of the semiconductor layers formed upon the substrate is of a C-plane Ga-surface type, and
wherein sheet doping concentration of the n-type delta doped GaN layer is within a range of $5\times10^{12}$ cm$^{-2}$ to $1.5\times10^{13}$ cm$^{-2}$.

6. An electronic circuit provided with the compound semiconductor FET as defined in claim 1.

* * * * *